United States Patent
Lee et al.

(10) Patent No.: US 7,531,834 B2
(45) Date of Patent: May 12, 2009

(54) ORGANIC ELECTROLUMINESCENT DISPLAY DEVICE WITH IMPROVED INTERFACE BETWEEN ANODE AND LUMINESCENT ORGANIC LAYER

(75) Inventors: Jeong-Yeol Lee, Suwon-si (KR); Joon-Young Park, Suwon-si (KR); Jae-Jung Kim, Suwon-si (KR); Kyoung-Wook Min, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 73 days.

(21) Appl. No.: 11/261,665

(22) Filed: Oct. 31, 2005

(65) Prior Publication Data

US 2006/0097263 A1    May 11, 2006

(30) Foreign Application Priority Data

Nov. 11, 2004    (KR)    ...... 10-2004-0091860

(51) Int. Cl.
*H01L 29/08* (2006.01)
*H01L 27/14* (2006.01)

(52) U.S. Cl. ............ 257/40; 257/72; 257/103; 257/E51.026

(58) Field of Classification Search ......... 257/72, 257/40, 103, E51.026
See application file for complete search history.

(56) References Cited

U.S. PATENT DOCUMENTS 7,317,208 B2 *    1/2008    You ............... 257/72
2004/0263072 A1 *    12/2004    Park et al. ............ 313/509
2005/0116240 A1 *    6/2005    Kim et al. ............ 257/88
2006/0091399 A1 *    5/2006    Lee ............... 257/72

FOREIGN PATENT DOCUMENTS

| JP | 11-307268 | 11/1999 |
|---|---|---|
| JP | 2000-133466 | 5/2000 |
| JP | 2003-031355 | 1/2003 |
| JP | 2003-317960 | 11/2003 |
| JP | 2003-332069 | 11/2003 |
| JP | 2004-071554 | 3/2004 |
| KR | 2001-0057125 | 7/2001 |
| KR | 10-2002-0083717 | 11/2002 |

OTHER PUBLICATIONS

Korean Office action for Korean Application No. 10-2004-0091860, dated Jun. 22, 2006 (English translation is attached).
Office action from the Japanese Patent Office issued in Applicant's corresponding Japanese Patent Application No. 2005-306081 dated Nov. 11, 2008.

* cited by examiner

*Primary Examiner*—Anh Phung
*Assistant Examiner*—Allison P Bernstein
(74) *Attorney, Agent, or Firm*—Robert E. Bushnell, Esq.

(57) ABSTRACT

An organic electroluminescent display device (OELD) that prevents particles from creating blind spots by forming a recess or a groove in the surface of an insulating layer that covers edges of a pixel electrode. The OELD includes a lower electrode arranged on a substrate, an insulating layer arranged on the substrate, the insulating layer having an aperture adapted to expose a portion of the lower electrode, an organic layer arranged on the exposed portion of the lower electrode, and an upper electrode arranged on the substrate, wherein the insulating layer includes a recess and/or a groove in its surface.

17 Claims, 8 Drawing Sheets

ORGANIC ELECTROLUMINESCENT DISPLAY DEVICE WITH IMPROVED INTERFACE BETWEEN ANODE AND LUMINESCENT ORGANIC LAYER

CLAIM OF PRIORITY

This application makes reference to, incorporates the same herein, and claims all benefits accruing under 35 U.S.C. §119 from an application for ORGANIC ELECTROLUMINESCENT DISPLAY DEVICE earlier filed in the Korean Intellectual Property Office on Nov. 11, 2004 and there duly assigned Serial No. 10-2004-0091860.

BACKGROUND OF THE INVENTION

1. Field of the Invention

The present invention relates to an organic electroluminescent display device (OELD), and more particularly, to an OELD that has a recess or a groove in the surface of an insulating layer that is located at edges of a pixel electrode.

2. Description of the Related Art

An active matrix organic electroluminescent display device (AMOELD) includes a plurality of pixels arranged on a substrate. Each of the pixels includes at least one switching thin film transistor, a driving thin film transistor, a capacitor, and an organic electroluminescent element. The organic electroluminescent element includes a lower electrode which is a pixel electrode, an upper electrode which is a cathode electrode, and an organic layer including a luminescent layer interposed between the upper and lower electrodes whose edges are covered by a pixel definition layer.

If the organic electroluminescent element is applied a predetermined bias to an anode electrode having a high work function and the cathode electrode having a relatively low work function from the outside, a hole and electron are injected into the luminescent layer from the anode electrode and the cathode electrode, respectively, and light having a predetermined color is emitted by the combination of the hole and the electron that have been injected into the luminescent layer.

The luminous efficiency of the light emitted from the luminescent layer greatly depends on interfacial characteristics between the anode electrode and the organic layer, and influences the life span of the organic electroluminescent element. A variety of methods have been used to improve the luminous efficiency of the organic electroluminescent element.

Korean Patent Publication No. 2001-0057125 has proposed a method of fabricating an organic luminescent element to improve interfacial characteristics between the anode electrode and an organic layer by processing an indium tin oxide (ITO) film which is an anode electrode with $SF_6$ plasma. Further, Japanese Patent Publication No. 2000-133466 has proposed a charge injection type luminescent element to improve interfacial characteristics between the anode electrode and an organic layer by applying oxygen ions or electrons onto an ITO film. What is needed is an improved structure for an OELD that results in improved interfacial characteristics between the anode and the organic layer.

SUMMARY OF THE INVENTION

It is therefore an object of the present invention to provide an improved structure for an OELD.

It is also an object to provide a design for an OELD that preserves the interface between the pixel electrode and the organic material by preventing particles from falling onto the pixel electrode.

It is also an object of the present invention to provide an organic electroluminescent display device (OELD) that prevents particles from creating dark spots by forming a recess or a groove in the surface of an insulating layer that covers edges of a pixel electrode.

These and other objects can be achieved by an organic electroluminescent display device (OELD) that includes a lower electrode arranged on a substrate, an insulating layer arranged on the substrate, the insulating layer having an aperture adapted to expose a portion of the lower electrode, the insulating layer also having a recess arranged in a surface thereof, an organic layer arranged on a portion of the lower electrode exposed by the aperture and an upper electrode arranged on the organic layer.

According to another aspect of the present invention, there is provided an OELD that includes a lower electrode arranged on a substrate, an insulating layer arranged on the substrate, the insulating layer having an aperture adapted to expose a portion of the lower electrode, the insulating layer also having a groove arranged in a surface thereof, an organic layer arranged on the exposed portion of the lower electrode and an upper electrode arranged on the organic layer.

The insulating layer being one or more of a pixel definition layer, a planarization layer, and a protection layer. The groove being located adjacent to edges of the aperture on the surface of the insulating layer, or is located over an entire surface of the insulating layer except the edges of the aperture. The groove is formed by scratching the surface of the insulating layer, or by brushing the surface of the insulating layer.

According to still another aspect of the present invention, there is provided an OELD that includes a thin film transistor arranged on a substrate, the thin film transistor including at least a source electrode and a drain electrode, a first insulating layer arranged on the substrate, the first insulating layer having an aperture adapted to expose one of the source electrode and drain electrode of the thin film transistor, a pixel electrode arranged on the first insulating layer and connected to one of the source electrode and drain electrode via the aperture in the first insulating layer, a second insulting layer arranged on the first insulating layer and including an aperture adapted to expose a portion of the pixel electrode, wherein the second insulating layer further includes a recess arranged in a surface thereof, an organic layer arranged on the exposed portion of the pixel electrode and an upper electrode arranged on the organic layer.

According to yet another aspect of the present invention, there is provided an OELD that includes a thin film transistor arranged on a substrate, the thin film transistor including at least a source electrode and a drain electrode, a first insulating layer arranged on the substrate, the first insulating layer having an aperture adapted to expose one of the source electrode and drain electrode of the thin film transistor, a pixel electrode arranged on the first insulating layer and connected to one of the source electrode and drain electrode via the aperture in the first insulating layer, a second insulting layer arranged on the first insulating layer and including an aperture adapted to expose a portion of the pixel electrode, wherein the second insulating layer further includes a groove arranged in a surface thereof, an organic layer arranged on the exposed portion of the pixel electrode and an upper electrode arranged on the organic layer.

The first insulating layer is one of a protection layer and a planarization layer, and the second insulating layer is a pixel definition layer. The groove is located adjacent to edges of the aperture on the surface of the second insulating layer, or is located in the over an entire surface of the second insulating layer except at the edges of the aperture. The groove is formed by scratching or brushing the surface of the second insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
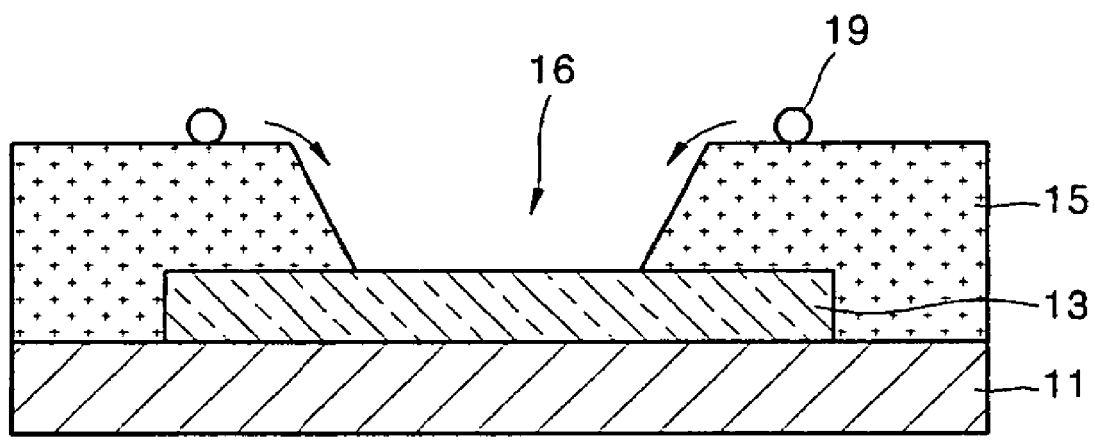
FIG. 1 is a cross-sectional view of a pixel electrode of an organic electroluminescent display device (OELD)

Turning now to the figures, FIG. 1 is a cross-sectional view of a pixel electrode of an organic electroluminescent display device (OELD). Referring to FIG. 1, a method of making a pixel definition layer includes depositing an insulating layer 15 for the pixel definition layer on a substrate with a pixel electrode 13 thereon, photo-etching the insulating layer 15 to expose a portion of a pixel electrode 13, thus forming an aperture 16 in insulating layer 15. Thereafter, a particle 19 on the surface of the pixel definition layer 15 moves to the surface of the pixel electrode 13 of the aperture 16 when a glass substrate is transferred or when an alignment operation with a mask for depositing an organic layer is performed. After the organic layer is deposited on the pixel electrode 13 and when the organic luminescent element is operated, the particle 19 absorbed on the surface of the pixel electrode 13 acts as a resistance material, resulting in current being collected. Such an operation causes blind spots.

Figure 2A:
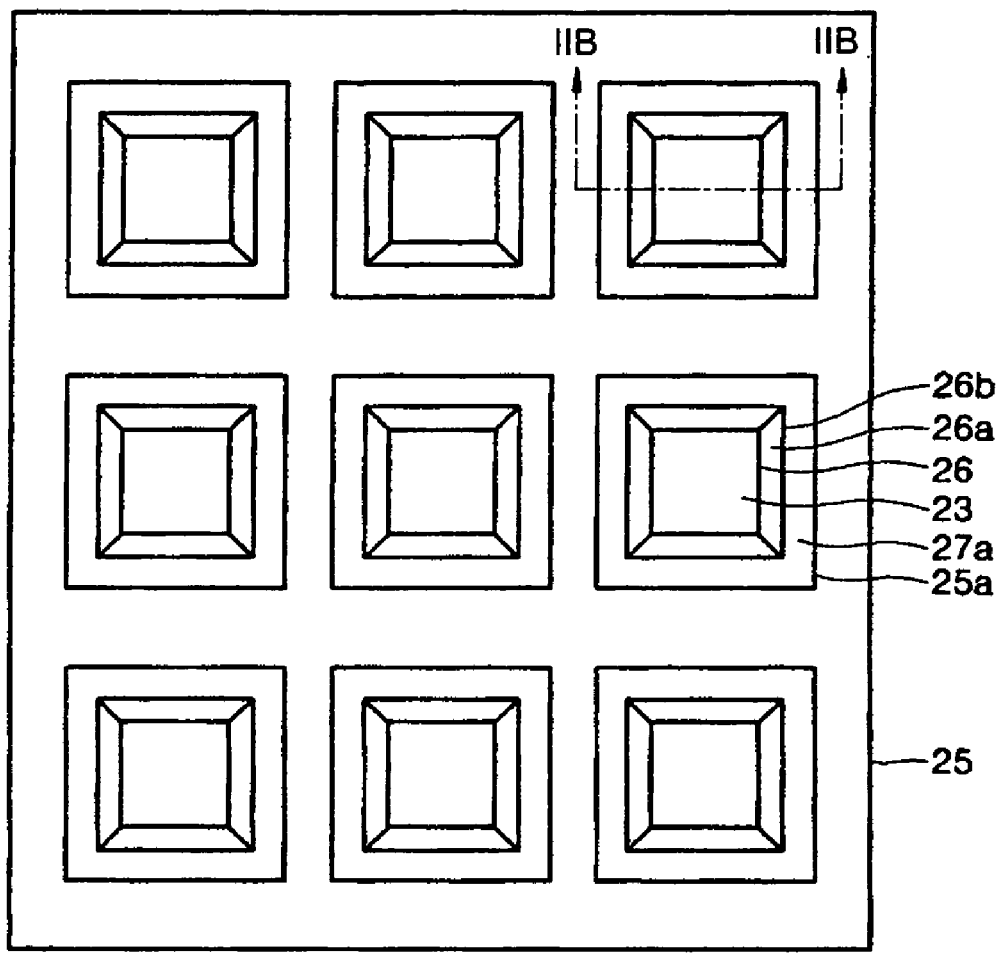
FIG. 2A is a plan view of a plurality of the pixel electrodes of the OELD according to an embodiment of the present invention.
Figure 2B:
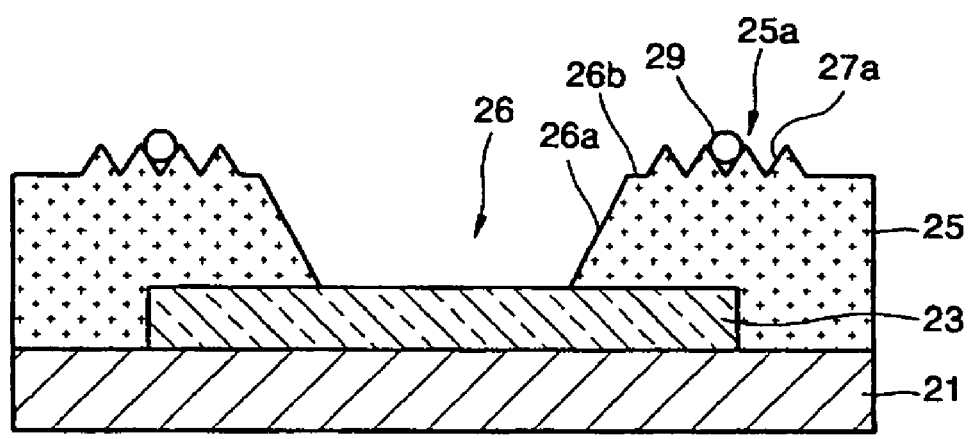
FIG. 2B is a cross-sectional view of a pixel electrode of an OELD of FIG. 2A.

Turning now to FIGS. 2A and 2B, FIG. 2A is a plan view of a plurality of the pixel electrodes of the OELD according to the current embodiment of the present invention and FIG. 2B is a cross-sectional view of a pixel electrode of an organic electroluminescent display device (OELD) of FIG. 2A taken along line IIB-IIB. The OELD of FIGS. 2A and 2B includes an anode electrode 23 which is a lower electrode and a pixel electrode and an insulating layer 25 that covers edges of the anode electrode 23 and is perforated by an aperture 26 exposing a portion of the anode electrode 23. The insulating layer 25 further includes recesses 27a which are formed on a part 25a adjacent to an edge 26b of aperture 26. The recesses 27a surround edge 26b of the aperture 26. The edge 26b of the aperture 26 is formed on the upper surface of the insulating layer 25.

The size of each recess 27a can be reduced in order to increase the surface area of the insulating layer 25 so that a particle 29 can be absorbed into the insulating layer 25 instead of allowing the particle 29 to fall onto the exposed portion of the anode electrode 26. Since the recesses 27a are used to prevent particles on the surface of the insulating layer 25 from getting inside the aperture 26, the recesses 27a can be formed adjacent to the aperture 26. The insulating layer 25 according to the embodiment of FIGS. 2A and 2B can be an organic insulating layer such as a pixel definition layer, a planarization layer, and a protection layer, or at least one multiplayer film.

Figure 3A:
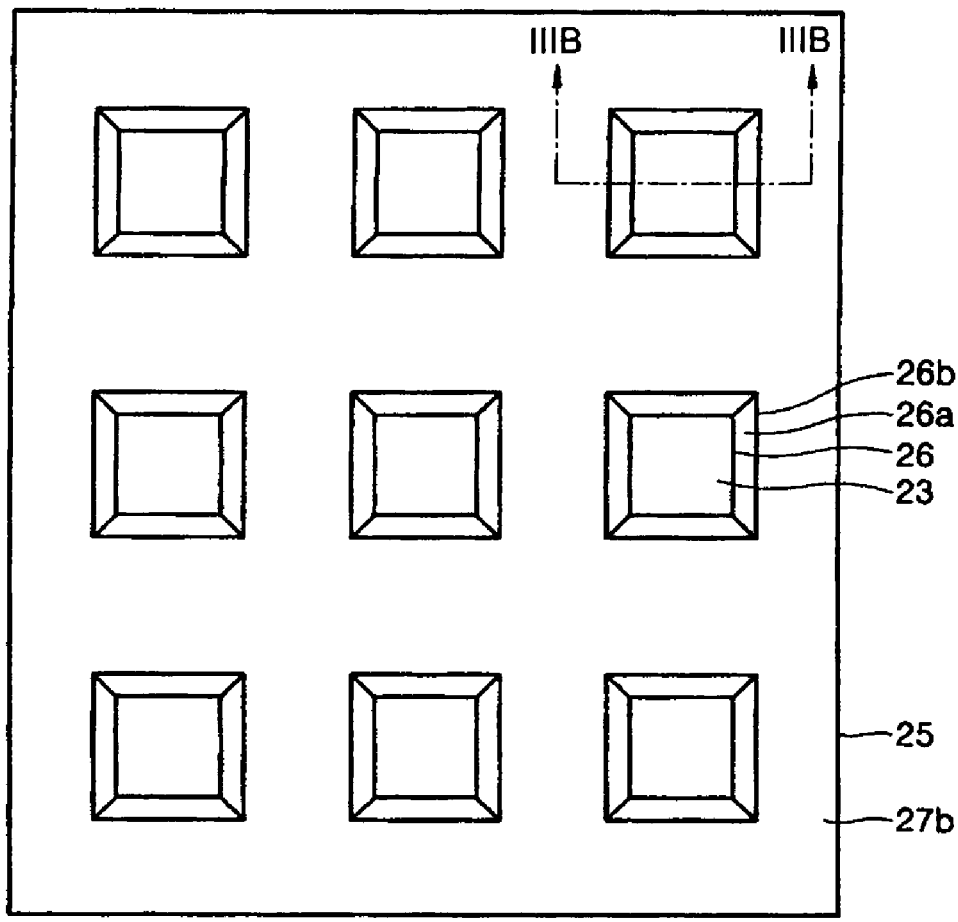
FIG. 3A is a plan view of a plurality of the pixel electrodes of the OELD according to another embodiment of the present invention.
Figure 3B:
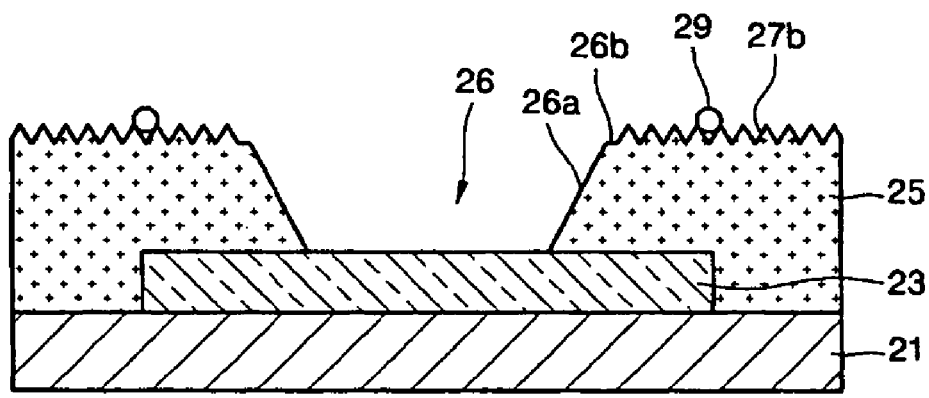
FIG. 3B is a cross-sectional view of a pixel electrode of an OELD of FIG. 3A.

Turning now to FIGS. 3A and 3B, FIG. 3A is a plan view of a plurality of the pixel electrodes of the OELD according to another embodiment of the present invention and FIG. 3B is a cross-sectional view of a pixel electrode of an OELD of FIG. 3A taken along line IIIB-IIIB. The OELD of FIGS. 3A and 3B includes an anode electrode 23 which is a pixel electrode and a lower electrode on substrate 21 and an insulating layer 25 covering edges of the anode electrode 23 and has aperture 26 that perforates insulating layer 25 exposing a portion of the anode electrode 23. Recesses 27b are formed on an entire upper surface of the insulating layer 25 except at side 26a of the aperture 26. The size of each recess 27b can be reduced in order to increase the surface area of the insulating layer 25 such that a particle 29 can be absorbed into the insulating layer 25 instead of falling on to the exposed portion of anode electrode 23. The insulating layer 25 can be a pixel definition layer, a planarization layer, and a protection layer, or at least one multilayer film.

The OELD according to the embodiment of FIGS. 3A and 3B includes recesses 27b in the surface of an insulating layer 25. Insulating layer 25 covers edges of an anode electrode 23. Recesses 27b prevent particle 29 from moving onto the portion of anode electrode 23 exposed by aperture 26 when a substrate is transferred or when an alignment operation using a deposition mask is performed. As a result, interfacial characteristics between an organic layer formed using a subsequent process and the anode electrode 23 are improved, thus preventing darkspots from occurring.

Figure 4A:
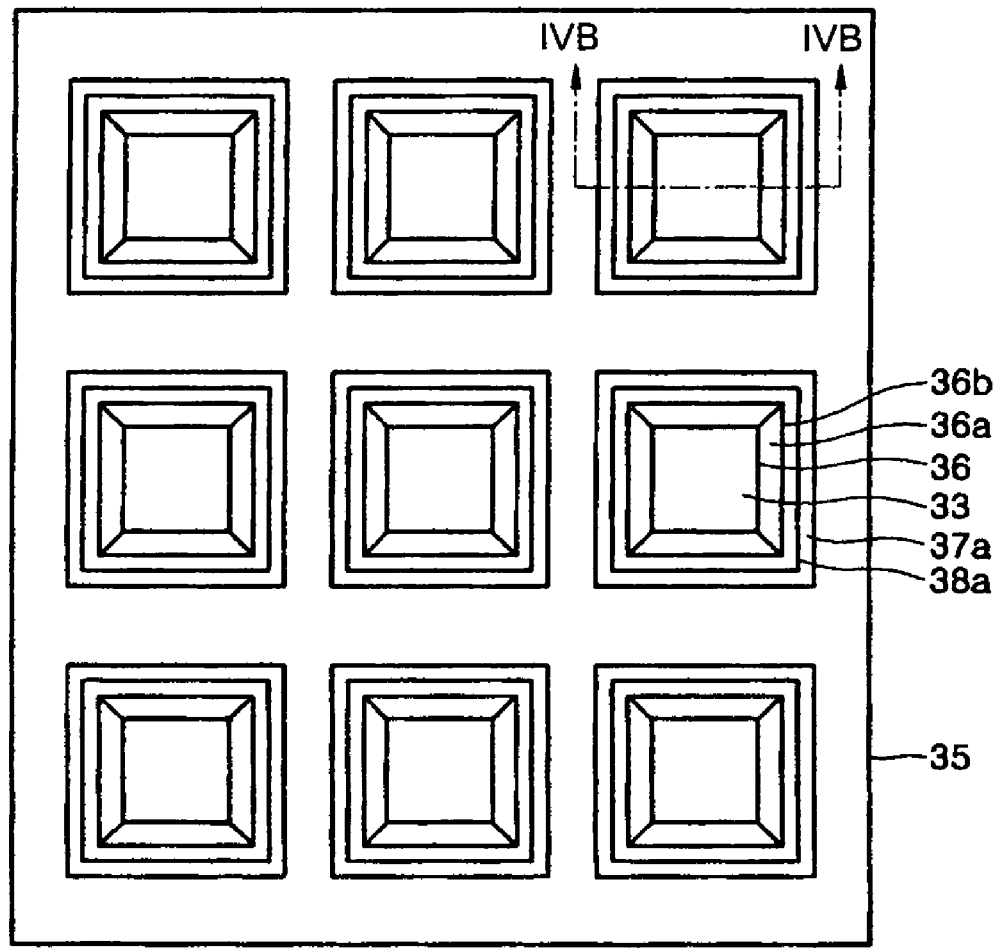
FIG. 4A is a plan view of a plurality of the pixel electrodes of the OELD according to still another embodiment of the present invention.
Figure 4B:
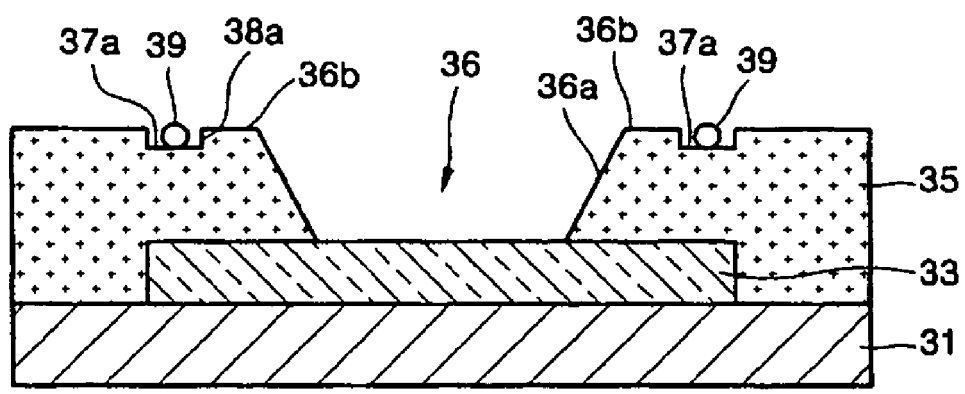
FIG. 4B is a cross-sectional view of a pixel electrode of an OELD of FIG. 4A.

Turning now to FIGS. 4A and 4B, FIG. 4A is a plan view of a plurality of the pixel electrodes of the OELD according to still another embodiment of the present invention and FIG. 4B is a cross-sectional view taken along line IVB-IVB of an OELD of FIG. 4A. The OELD of FIGS. 4A and 4B includes an anode electrode 33 which is a pixel electrode and a lower electrode and an insulating layer 35 having an aperture 36 for exposing a portion of the anode electrode 33 while covering edges of anode electrode 33. The insulating layer 35 includes a groove 37a which is formed in an upper surface of insulating layer 35 adjacent to an edge 36b of the aperture 36. The edge 36b of the aperture 36 is formed on the upper surface of the insulating layer 35. The reference numeral 38a designates the side of the groove 37a.

Since the groove 37a formed in the insulating layer 35 is used to prevent a particle 39 on the surface of the insulating layer 35 from getting inside the aperture 36, the groove 37a can be formed adjacent to the aperture 36. The groove 37a surrounds edge 36b of the aperture 36. The insulating layer 35 according to the embodiment of FIGS. 4A and 4B can be made of an organic insulating layer and be a pixel definition layer, a planarization layer, a protection layer, or at least one multilayer film.

Figure 5A:
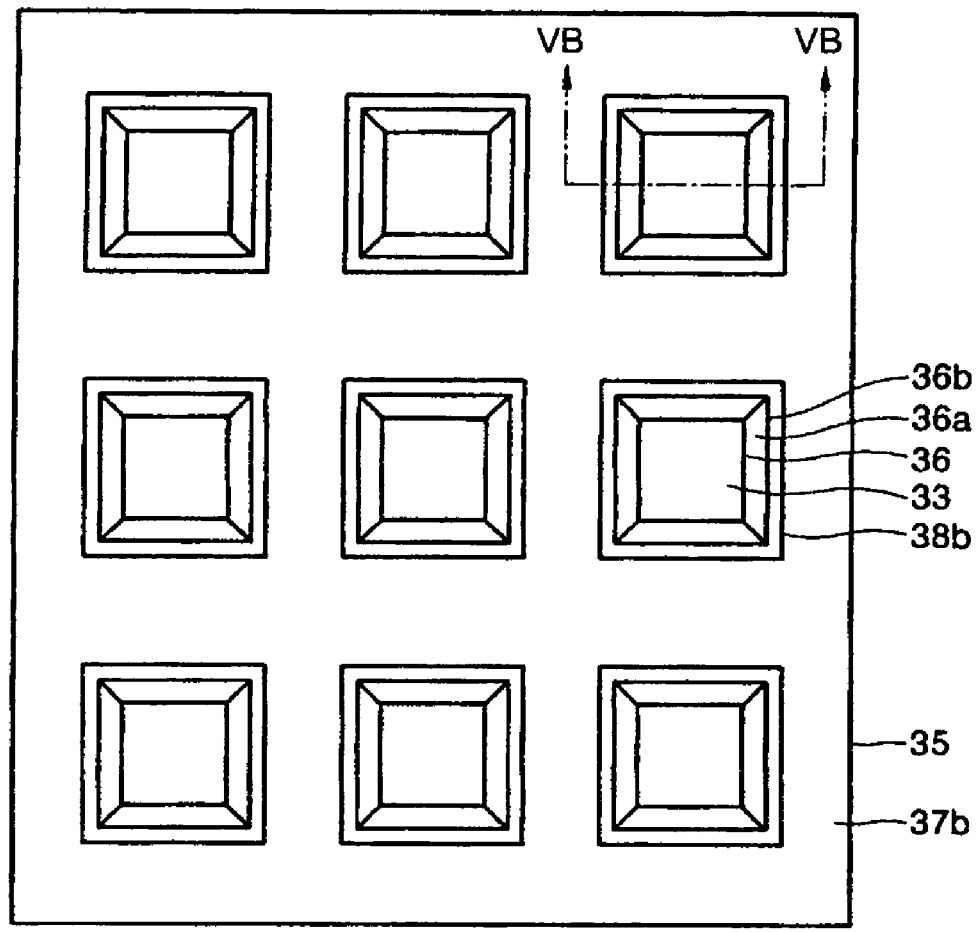
FIG. 5A is a plan view of a plurality of the pixel electrodes of the OELD according to yet another embodiment of the present invention.
Figure 5B:
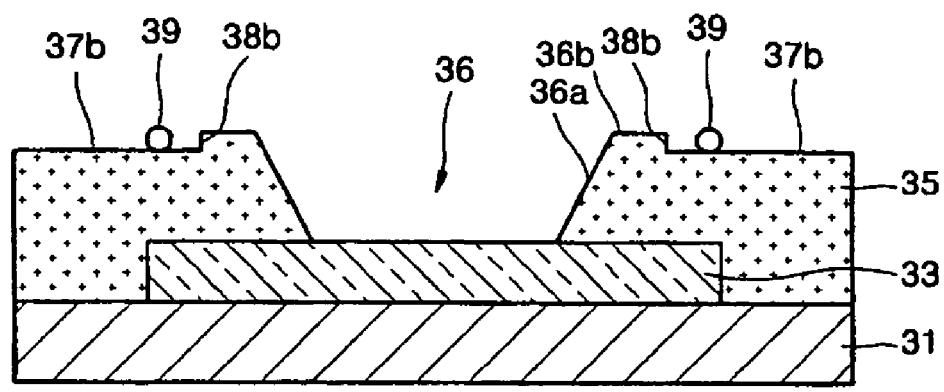
FIG. 5B is a cross-sectional view of a pixel electrode of an OELD of FIG. 5A.

Turning now to FIGS. 5A and 5B, FIG. 5A is a plan view of a plurality of the pixel electrodes of the OELD according to yet another embodiment of the present invention and FIG. 5B is a cross-sectional view of a pixel electrode of an OELD of FIG. 5A taken along line VB-VB. The OELD of FIGS. 5A and 5B includes an anode electrode 33 which is a pixel electrode and a lower electrode and an insulating layer 35 having an aperture 36 that exposes a part of the anode electrode 33 and covers edges of anode electrode 33. A groove 37b is formed on the entire surface of the insulating layer 35 except a part adjacent to an edge 36b of the aperture 36. The edge 36b of the aperture 36 is also formed on the upper surface of the insulating layer 35. The reference numeral 38b designates the side of the groove 37b.

In order to prevent a particle on the upper surface of the insulating layer 35 from getting inside the aperture 36, the groove 37b can be formed in an engraving pattern such that the part adjacent to the edge 36b of the aperture 36 on the surface of the insulating layer 35 can be stepped-up from other parts of the upper surface of insulating layer 35. The insulating layer 35 according to the embodiment of FIGS. 5A and 5B can be made out of an organic insulating layer such as a pixel definition layer, a planarization layer, and a protection layer, or at least one multilayer film.

The OELD according to the embodiment of FIGS. 5A and 5B includes a groove 37b with an engraving pattern on the upper surface of insulating layer 35, the insulating layer 35 covering edges of an anode electrode 33, the insulating layer 35 having an aperture 36. The presence of groove 37b causes a particle 39 to be absorbed into the insulating layer 35, thus preventing the particle 39 from moving onto the anode electrode 33 when a substrate is transferred or when an alignment operation using a deposition mask is performed. Therefore, interfacial characteristics between an organic layer formed using a subsequent process on the anode electrode 33 are improved, thus preventing dark spots from occurring.

According to the embodiment of FIGS. 5A and 5B, the groove 37b is formed in the upper surface of the insulating layer 35 to prevent the particle 39 from moving onto the anode electrode 33. However, the engraving pattern can be formed on the surface of the insulating layer such that the part of upper surface of insulating layer 35 adjacent to the edge 36b of the aperture 36 has a higher step than other parts of the upper surface of the insulating layer 35.

Figure 6A:
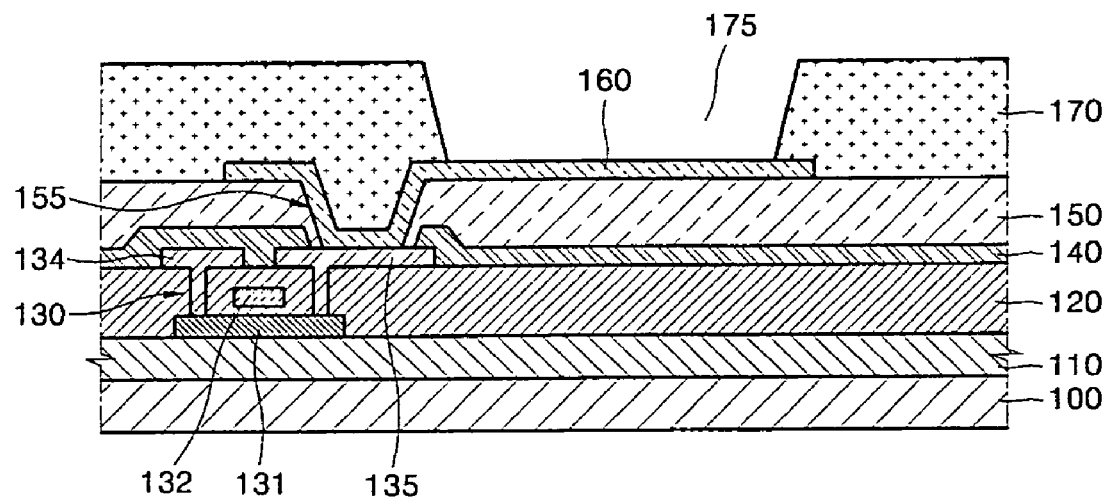
FIGS. 6A through 6C are sectional views of processing sequences illustrating a method of fabricating a front luminescent type OELD of FIGS. 2A and 2B according to an embodiment of the present invention.
Figure 6B:
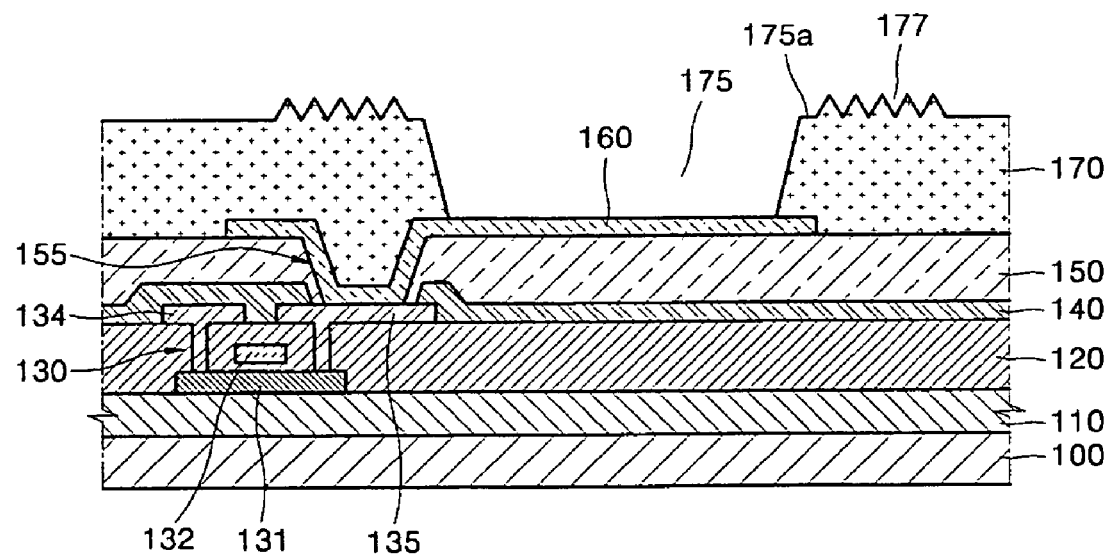
Figure 6C:
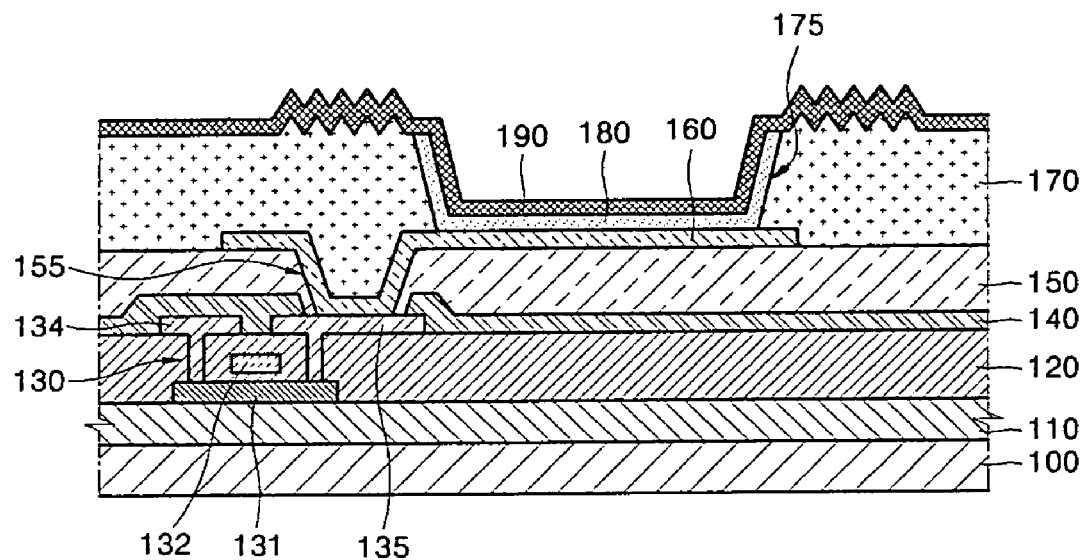

Turning now to FIGS. 6A through 6C, FIGS. 6A through 6C are sectional views of processing sequences illustrating a method of fabricating a front luminescent type OELD of FIGS. 2A and 2B according to an embodiment of the present invention. Referring to FIG. 6A, a buffer layer 110 is formed on a substrate 100, and a thin film transistor 130 is formed on the buffer layer 110. The thin film transistor 130 includes a semiconductor layer 131, a gate electrode 132, a source electrode 134, and a drain electrode 135.

Although not illustrated in FIGS. 6A through 6C, the semiconductor layer 131 includes source and drain regions. The source electrode 134 and the drain electrode 135 are connected to the source and drain regions of the semiconductor layer 131 via contact holes formed in an insulating layer 120, respectively. The insulating layer 120 is interposed between the semiconductor layer 131 and the gate electrode 132, and between the gate electrode 132 and the source electrode 134 and the drain electrode 135. The insulating layer 120 includes a gate insulating layer and an interlayer insulating layer.

A protection layer 140 is formed on the insulating layer 120. The protection layer 140 includes a via hole exposing one of the source electrode 134 and the drain electrode 135 of the thin film transistor 130. In FIGS. 6A through 6C, the via hole is shown to expose the drain electrode 135. A planarization layer 150 including a via hole 155 exposing the drain electrode 135 of the thin film transistor 130 is formed on the protection layer 140.

A lower electrode 160 of an organic electroluminescent element is formed on the planarization layer 150. The lower electrode 160 is connected to the drain electrode 135 of the thin film transistor 130 via the via hole 155. The lower electrode 160 is a pixel electrode and acts as an anode electrode. Since the OELD of FIGS. 6A through 6C has a front luminescent structure, the lower electrode 160 is reflective. Although not illustrated in FIGS. 6A through 6C, the lower electrode 160 forms a reflection layer in its lower part and includes a transparency electrode material.

A pixel definition layer 170, e.g., an organic insulating layer such as a polyamidic organic layer or an acrylic organic layer, is formed on the planarization layer 150 on which the lower a electrode 160 is formed, and is photo-etched to expose a part of the lower electrode 160, such that an aperture 175 is formed.

Referring to FIG. 6B, a recesses 177 are formed in the upper surface of the pixel definition layer 170 by scratching or brushing the surface of the pixel definition layer 170. The recesses 177 can be formed adjacent to an edge 175a of the aperture 175.

Referring to FIG. 6C, an organic layer 180 is formed on the lower electrode 160. A cathode electrode 190 is formed on the organic layer 180. The organic layer 180 can include one or more organic layers that can include a hole injection layer, a hole transfer layer, an organic luminescent layer, an electron transfer layer, an electron injection layer, and a hole barrier layer. The cathode electrode 190 is a transparent electrode.

The method of fabricating the OELD illustrated in FIGS. 6A through 6C is applied to the is front luminescent type OELD illustrated in FIGS. 2A and 2B. However, the method is not restricted thereto but can also be applied to the front luminescent type OELD illustrated in any of FIGS. 3A through 5B.

Figure 7A:
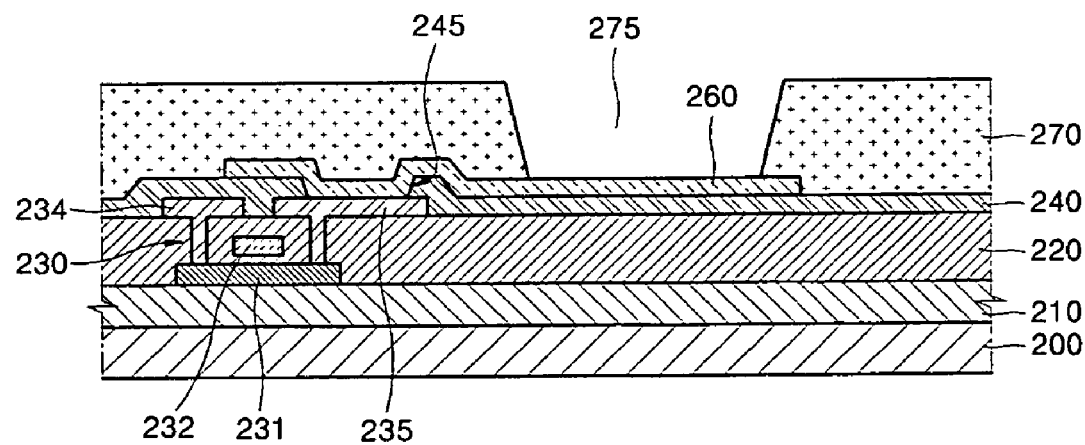
FIGS. 7A through 7C are sectional views of processing sequences illustrating a method of fabricating a back luminescent type OELD of FIGS. 4A and 4B according to still another embodiment of the present invention.
Figure 7B:
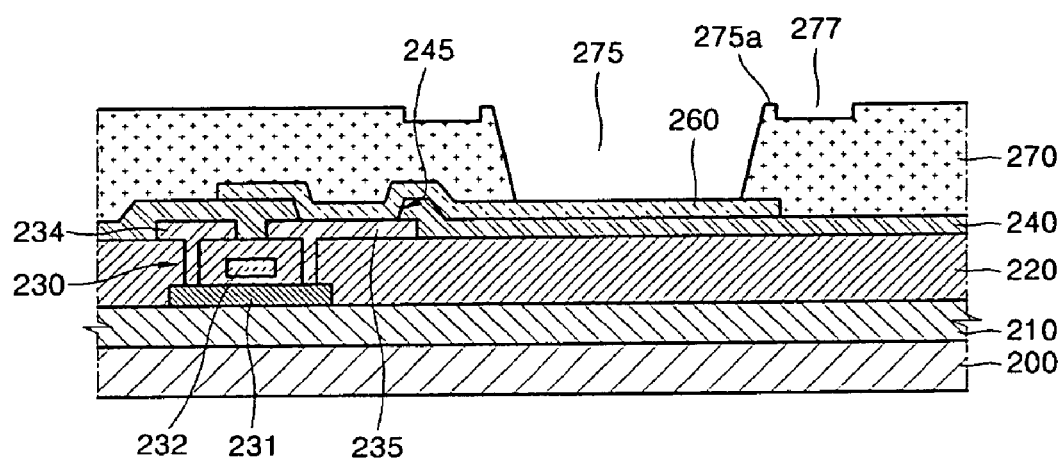
Figure 7C:
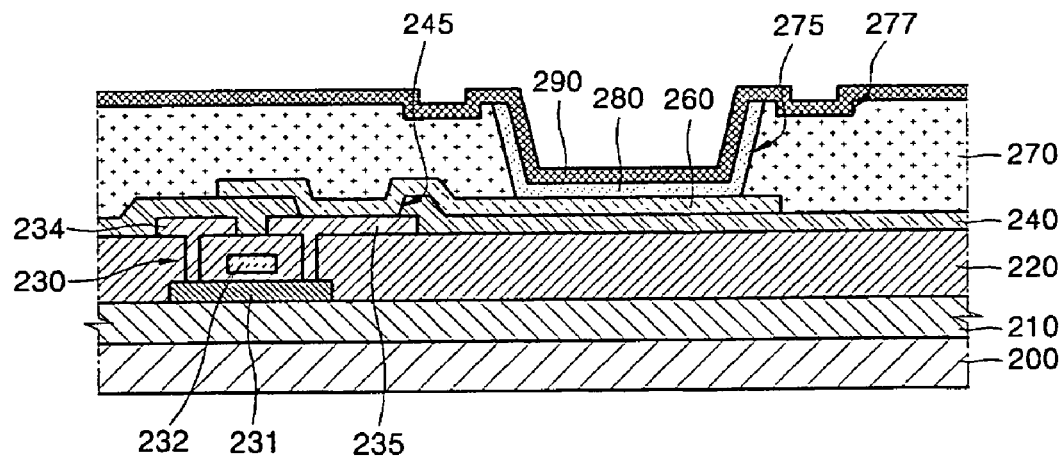

Turning now to FIGS. 7A through 7C, FIGS. 7A through 7C are sectional views of processing sequences illustrating a method of fabricating a back luminescent type OELD having a structure similar to that of FIGS. 4A and 4B according to an embodiment of the present invention. Referring to FIG. 7A, a buffer layer 210 is formed on a substrate 200, and a thin film transistor 230 is formed on the buffer layer 210. The thin film transistor 230 includes a semiconductor layer 231, a gate electrode 232, a source electrode 234, and a drain electrode 235.

Although not shown in the drawings, the semiconductor layer 231 includes source and drain regions. The source electrode 234 and the drain electrode 235 are connected to the source and drain regions of the semiconductor layer 231 via contact holes formed in an insulating layer 220, respectively. The insulating layer 220 is interposed between the semiconductor layer 231 and the gate electrode 232, and between the gate electrode 232 and the source electrode 234 and the drain electrode 235. The insulating layer 220 includes a gate insulating layer and an interlayer insulating layer.

A protection layer 240 is formed on the insulating layer 220. The protection layer 240 includes a via hole 245 that exposes one of the source electrode 234 and the drain electrode 235 of the thin film transistor 230. In FIGS. 7A through 7C, it is the drain electrode 235 that is exposed by via hole 245. A lower electrode 260 of an organic electroluminescent element is formed on the protection layer 240. The lower electrode 260 is connected to the drain electrode 235 of the thin film transistor 230 via the via hole 245. The lower electrode 260, which is a pixel electrode, serves as an anode electrode. Since the OELD of the embodiment of FIGS. 7A through 7C is a back luminescent structure, the lower electrode 260 is transparent.

A pixel definition layer 270, e.g., an organic insulating layer, such as a polyamidic organic layer or an acrylic organic layer, is formed on the lower electrode 260 and on the protection layer 240. Pixel definition layer 270 is photo-etched through to form aperture 275 exposing a part of the lower electrode 260.

Referring now to FIG. 7B, a groove 277 is formed in the upper surface of the pixel definition layer 270 by scratching or brushing the surface of the pixel definition layer 270. The groove 277 is formed in an engraving pattern adjacent to an edge 275a of the aperture 275.

The groove 277 is formed by photo-etching the aperture 275 on the pixel definition layer 270 using a first mask (not shown) and a second mask (not shown) in turn. Furthermore, the aperture 275 and the groove 277 can be simultaneously formed by photo-etching the pixel definition layer 270 using a half-tone mask (not shown).

Referring to FIG. 7C, an organic layer 280 is formed on a section of the lower electrode 260, exposed by the aperture 275 in the pixel definition layer 270. A cathode electrode 290 is formed on the resultant structure. The cathode electrode 290 is opaque. The organic layer 280 can be made up of one or more organic layers, the organic layers being one or more of a hole injection layer, a hole transfer layer, an organic luminescent layer, an electron transfer layer, an electron injection layer, and a hole barrier layer.

Although the above-described method of fabricating the OELD illustrated in FIGS. 7A through 7C is for a back luminescent type OELD having a structure similar to that of FIGS. 4A and 4B, the method is not restricted thereto but can also be applied to a back luminescent type OELD having a structure similar to that of any of FIGS. 2A through 5B.

The current embodiment of the invention provides a method of forming a recess or a groove in a pixel definition layer for exposing a part of an anode electrode. However, the present invention is not restricted thereto but can be applied to a method of fabricating an OELD that forms a recess or a groove in a planarization layer or a protection layer that covers edges of the pixel electrode. Although the present invention provides an OELD having back and front luminescent structures, the present invention can also apply to a double sided luminescent type OELD. Furthermore, although the OELDs of the present invention include a thin film transistor that functions as an operating element for operating an organic electroluminescent element, the present invention can be applied to a variety of other elements such as an organic thin film transistor.

According to the method of fabricating the OELD of the present invention, the recess or the groove formed in the pixel definition layer covering edges of the pixel electrode prevents particles on the pixel definition layer from moving onto the anode electrode inside the aperture, thus preventing dark spots from being created and increasing the life span of the OELD.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent display device (OELD), comprising:
    a lower electrode arranged on a substrate;
    an insulating layer arranged on the substrate, the insulating layer having an aperture adapted to expose a portion of the lower electrode, the insulating layer also having a plurality of recesses arranged in a top surface of said insulating layer;
    an organic layer arranged on the exposed portion of the lower electrode exposed by the aperture, the organic layer including an organic luminescent layer adapted to emit light; and
    an upper electrode arranged on the organic layer,
    wherein more than two of said plurality of recesses is located on an opposite side of said aperture from more than two of said plurality of recesses,
    wherein said top surface of said insulating layer is a side furthest from said substrates,
    wherein said plurality of recesses have a same shape and are in a same planar level.

2. The OELD of claim 1, wherein the insulating layer is selected from a group consisting of a pixel definition layer, a planarization layer, and a protection layer.

3. The OELD of claim 1, wherein the recess is arranged in a part of the surface of the insulating layer adjacent to edges of the aperture.

4. The OELD of claim 1, wherein the recess is arranged in an entire surface of the insulating layer except at edges of the aperture defining a raised rim about the aperture.

5. The OELD of claim 1, comprising:
    a thin film transistor arranged on the substrate, the lower electrode comprising at least one of a source electrode and a drain electrode for the thin film transistor;
    the insulating layer comprising a first insulating layer, and the aperture in the first insulating layer exposing one of the source electrode and drain electrode of the thin film transistor;
    a pixel electrode arranged on the first insulating layer and connected to one of the source electrode and drain electrode via the aperture in the first insulating layer; and
    a second insulting layer arranged on the first insulating layer and having an aperture adapted to expose a portion of the pixel electrode, wherein the second insulating layer further includes a groove arranged in a surface thereof.

6. The OELD of claim 5, with the first insulating layer selected from the group consisting of a pixel definition layer, a planarization layer, and a protection layer.

7. The OELD of claim 1, the organic layer being separate and distinguished from the insulating layer.

8. The OELD of claim 7, the recess going only partly through the insulating layer.

9. An organic electroluminescent display device (OELD), comprising:
    a lower electrode arranged on a substrate;
    an insulating layer arranged on the substrate, the insulating layer having an aperture adapted to expose a portion of the lower electrode, the insulating layer also having a plurality of grooves arranged in a top surface of said insulating layer;
    an organic layer arranged on the exposed portion of the lower electrode; and an upper electrode arranged on the organic layer, wherein said plurality of grooves is formed in an entire surface of the insulating layer except at edges of the aperture, wherein more than two of said plurality of grooves is located on an opposite side of said aperture from more than two of said plurality of grooves, wherein said top surface of said insulating layer is a side furthest from said a substrates, wherein said plurality of grooves have a same shape and are in a same planar level.

10. The OELD of claim 9, wherein the insulating layer is selected from a group consisting of a pixel definition layer, a planarization layer, and a protection layer.

11. The OELD of claim 9, wherein the groove is arranged in a part of the surface of the insulating layer adjacent to edges of the aperture.

12. An organic electroluminescent display device (OELD), comprising:

a thin film transistor arranged on a substrate, the thin film transistor including at least a source electrode and a drain electrode;

a first insulating layer arranged on the substrate, the first insulating layer having an aperture adapted to expose one of the source electrode and drain electrode of the thin film transistor;

a pixel electrode arranged on the first insulating layer and connected to one of the source electrode and drain electrode via the aperture in the first insulating layer;

a second insulting layer arranged on the first insulating layer and including an aperture adapted to expose a portion of the pixel electrode, wherein the second insulating layer further includes a plurality of recesses arranged in a top surface of said second insulating layer;

an organic layer arranged on the exposed portion of the pixel electrode; and an upper electrode arranged on the organic layer, wherein more than two of said plurality of recesses is located on an opposite side of said aperture from more than two of said plurality of recesses, wherein said top surface of said second insulating layer is a side furthest from said a substrates, wherein said plurality of recesses have a same shape and are in a same planar level.

13. The OELD of claim 12, wherein the first insulating layer is one of a protection layer and a planarization layer, and the second insulating layer comprises a pixel definition layer.

14. The OELD of claim 12, the pixel electrode being arranged between the first insulating layer and the second insulating layer.

15. The OELD of claim 12, the second insulating layer being separate and distinguished from the first insulating layer.

16. An organic electroluminescent display device (OELD), comprising:

a thin film transistor arranged on a substrate, the thin film transistor including at least a source electrode and a drain electrode;

a first insulating layer arranged on the substrate, the first insulating layer having an aperture adapted to expose one of the source electrode and drain electrode of the thin film transistor;

a pixel electrode arranged on the first insulating layer and connected to one of the source electrode and drain electrode via the aperture in the first insulating layer;

a second insulting layer arranged on the first insulating layer and having an aperture adapted to expose a portion of the pixel electrode, wherein the second insulating layer further includes a plurality of grooves arranged in a top surface thereof of said second insulating layer;

an organic layer arranged on the exposed portion of the pixel electrode; and an upper electrode arranged on the organic layer, wherein more than two of said plurality of grooves is located on an opposite side of said aperture from more than two of said plurality of grooves, wherein said top surface of said second insulating layer is a side furthest from said a substrates, wherein said plurality of grooves have a same shape and are in a same planar level.

17. The OELD of claim 16, wherein the first insulating layer is one of a protection layer and a planarization layer, and the second insulating layer comprises a pixel definition layer.

* * * * *